(12) United States Patent
Shi et al.

(10) Patent No.: US 8,329,319 B2
(45) Date of Patent: Dec. 11, 2012

(54) PHASE CHANGE MAGNETIC MATERIAL

(75) Inventors: Luping Shi, Singapore (SG); Wendong Song, Singapore (SG); Xiangshui Miao, Singapore (SG); Tow Chong Chong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 146 days.

(21) Appl. No.: 12/090,562

(22) PCT Filed: Oct. 17, 2005

(86) PCT No.: PCT/SG2005/000357
§ 371 (c)(1), (2), (4) Date: Sep. 4, 2008

(87) PCT Pub. No.: WO2007/046769
PCT Pub. Date: Apr. 26, 2007

(65) Prior Publication Data
US 2009/0148649 A1    Jun. 11, 2009

(51) Int. Cl.
*G11B 5/65* (2006.01)
(52) U.S. Cl. ............ 428/812; 428/821; 428/836.1; 428/64.4; 428/212; 428/692.1
(58) Field of Classification Search .................. None
See application file for complete search history.

(56) References Cited

U.S. PATENT DOCUMENTS

| | | | |
|---|---|---|---|
| 5,709,978 A | 1/1998 | Hirotsune et al. | |
| 5,912,104 A * | 6/1999 | Hirotsune et al. | 430/270.13 |
| 6,132,524 A | 10/2000 | Akinaga et al. | |
| 7,463,573 B2 * | 12/2008 | Fan et al. | 369/126 |
| 7,851,779 B2 * | 12/2010 | Chong et al. | 257/4 |
| 2003/0027398 A1 | 2/2003 | Maimon et al. | |
| 2003/0133366 A1* | 7/2003 | Tabata | 369/13.47 |
| 2008/0026257 A1 | 1/2008 | Takagi et al. | |

FOREIGN PATENT DOCUMENTS

| | | |
|---|---|---|
| JP | 10-172195 A | 6/1998 |
| JP | 2003-246140 A | 9/2003 |
| JP | 2003246140 A * | 9/2003 |
| JP | 2004-216909 A | 8/2004 |
| JP | 2004-284024 A | 10/2004 |
| JP | 2004-319033 A | 11/2004 |
| JP | 2006-0532739 A | 8/2005 |

(Continued)

OTHER PUBLICATIONS

JPO Abstract Translation of Harigai et al. (JP 2003-246140 A) (Pat-No.: JP02003246140A) (pub. 2003).*

(Continued)

*Primary Examiner* — Kevin Bernatz
(74) *Attorney, Agent, or Firm* — Blakely, Sokoloff, Taylor & Zafman LLP

(57) ABSTRACT

The invention relates to a phase change magnetic composite material for use in an information recording medium, said material comprising a phase change material component, and a ferromagnetic material component, wherein said material exhibits both magnetic effects and phase change effects, and is usable for optical media, phase change random access memory (PCRAM) devices, magnetic random access memory (MRAM) devices, solid state memory devices, sensor devices, logical devices, cognitive devices, artificial neuron network, three level device, control device, SOC (system on chip) device, and semiconductors.

23 Claims, 13 Drawing Sheets

FOREIGN PATENT DOCUMENTS

| | | |
|---|---|---|
| WO | WO 2005/027134 A2 | 3/2005 |
| WO | WO-2005-081256 A1 * | 9/2005 |
| WO | WO 2006/025413 A1 | 3/2006 |

OTHER PUBLICATIONS

Machine Translation of Harigai et al. (JP 2003-246140 A) (pub. 2003).*

Feinleib et al., "Rapid reversible light-induced crystallization of amorphous semiconductors," Applied Physics Letters, Mar. 15, 1971, 18(6):254-257.

Sato et al., "Material Design of GaN-Based Ferromagnetic Diluted Magnetic Semiconductors," Jpn. J. Appl. Phys., 2001, 40:L485-L487.

Shi et al., "Study of the Dynamic Crystallization Behavior of GeSbTe Phase Change Optical Disk," Jpn. J. Appl. Phys., 2003, 42:841-847.

Sun et al., "Epitaxial $L1_0$ magnetic thin films sputtered on Cu (001)," Applied Physics Letters, Mar. 24, 2003, 82(12):1902-1904.

Supplementary European Search Report dated Jun. 30, 2010, in corresponding EP 05792871.5, 7 pages.

Fukuma et al., "Fabrication of $Ge_{1-x}Mn_x$ Te ferromagnetic fine structure using phase change technology," J. Appl. Phys., Jun. 1, 2001, 89(11):7389-7391.

Wu et al., "Study of crystallization kinetics in GeSbTeSeM (M=Cu, Co, Ni, Ph) phase change materials," The Institution of Electrical Engineers, 2001, 1 pages abstract.

Office Action dated Aug. 10, 2010, in corresponding Japanese Patent Application No. 2008-536551, 3 pages, with English translation, 4 pages.

Final Office Action dated May 17, 2011, in corresponding Japanese Patent Application No. 2008-536551, 2 pages, with English translation, 3 pages.

Office Action for counterpart Taiwanese Patent Application No. 095132522. 5 pgs. (Dec. 31, 2011).

Search Report for counterpart Taiwanese Patent Application No. 095132522 with English translation, 2 pgs. (Dec. 4, 2011).

* cited by examiner

| Phase | Resistivity ($\Omega$cm) | |
|---|---|---|
| | Phase change material | Magnetic phase change material |
| Amorphous | $1 \sim 10^3$ | $1 \sim 10^3$ |
| Crystalline | $10^{-1} \sim 10^{-4}$ | $10^{-1} \sim 10^{-4}$ |

FIG. 5

PHASE CHANGE MAGNETIC MATERIAL

CROSS-REFERENCE TO RELATED APPLICATIONS

This application is a National Stage application of PCT/SG2005/000357, filed Oct. 17, 2005.

This invention relates to a novel material, in particular, a novel phase change magnetic material and methods of making the same. The invention also relates to the uses of the material in optical media, phase change random access memory (PCRAM) devices, magnetic random access memory (MRAM) devices, solid state memory devices, sensor devices, logical devices, cognitive devices, artificial neuron network, three level device, control device, SOC (system on chip) device, and semiconductors.

BACKGROUND OF THE INVENTION

Over the last three decades, materials for rewritable media have been receiving an increasing amount of interest in the scientific community and the industry. Since the discovery of chalcogenide film materials in 1968, materials have developed into a complex technology which find uses in many important applications, including electrical write and erase non-volatile memory devices, cognitive semiconductors, and rewritable optical discs.

Recent research efforts have been focussed on the development of non-volatile phase change random access memory and rewritable discs with high storage capacities and fast read-write speeds. Examples of such rewritable media that are now widely in use include rewritable compact discs (CD-RW), rewritable digital video discs (DVD-RAM, DVD-RW, DVD+RW) and rewritable blue laser optical disc (Blu-ray, HD-DVD).

Phase change media utilise phase change materials as recording media. The media is thermally written and optically read. Data is written and erased by inducing a change in phase of the material between crystalline phase and the amorphous phase. A laser beam is typically used to heat the material to bring about a change of phase. As each phase is associated with a different level of light reflectivity, namely, the crystalline phase is highly reflective, and the amorphous phase is lowly reflective, both lowly reflective mark and highly reflective background spots can be formed on the material to represent computer-readable data bits.

The use of rewritable material for optical discs was first reported in 1971 in which the recording media comprised chalcogenide phase-change composite material (Feinleib et al., Appl. Phys. Lett. Vol. 18 (1971) pg. 254). Since then, many attempts have been made to provide new materials for rewritable media in response to the increase in computer data size and the corresponding increase in the demand for larger storage capacity and faster read-write speeds.

For example, U.S. Pat. No. 5,709,978 discloses a phase change recording film for use in double sided optical discs in which the recording material comprises a phase change component such as Sb—Te—Ge and at least one lanthanide element and a transition metal. A high melting point component is precipitated in the recording film to coexist with a phase change component to prevent the recording film from flowing and segregating during recording and erasing.

Another type of rewritable media that is widely in use is magneto-optical (MO) media (used for example in Mini Discs). MO media operates based on both magnetic and optical storage device principles: writing is carried out magnetically after thermal treatment, and reading is carried out optically. Typically, a focussed laser beam is applied onto one side of the media in order to heat the MO material to its Curie point or compensation temperature, and thus render it susceptible to a magnetic field. A magnetic head positioned on the opposite side of the disc is then operated to record digital data onto the disk by altering the magneto-optical polarity of the heated area.

U.S. Pat. No. 6,132,524 discloses an example of a semiconductor magneto-optical material. The material comprises a semiconductor such as MsAs:GaAs in which fine magnetic particles are dispersed. The material exhibits magneto-optical effects at room temperature and can be used for signal processing and the fabrication of optical isolators and integrated circuits.

Composites comprising two or more kinds of material components and their use in recording media have been disclosed in U.S. Pat. No. 5,709,978. In carrying out the synthesis of the composites, material components of the composites are either combined and prepared from a simple mixture, or one material component is precipitated in the other material component. Such composites exhibit either magnetic or phase change properties individually, but is incapable of exhibiting both magnetic and phase change properties simultaneously.

Several studies into materials for optical discs have been carried out. In a study of the erasing process in optical rewritable discs, Shi et al. discloses the use of phase change material $Ge_2Sb_2Te_5$ in optical rewritable discs and the dynamic crystallisation behaviour in relation to the erasure of data on such discs (Jpn. J. Appl. Phys. Vol. 42, Part 1, No. 2B, pp 841-847, 2003).

In another study, Sato et al. discloses a GaN-based ferromagnetic diluted magnetic semiconductor for semiconductor devices (Jpn. J. Appl. Phys. Vol. 40, Part 2, No. 5B, pp. L485-L487, 2001). In yet another study, Sun et al. (Appl. Phys. Lett. Vol. 82 No. 12 pp, 1902-1904, 2003.) discloses the use of FePt magnetic films sputtered on Cu.

Despite the developments that have taken place, limitations in current materials still exist. For example, the capacity and recording speed of rewritable optical media are presently limited by the laser diffraction limit and the crystallisation speed of the recording material. Therefore, continuing efforts are needed to provide new materials having new characteristics.

Accordingly, it is an object of the present invention to provide new materials that, for example, give rise to improved performance.

SUMMARY OF THE INVENTION

According to a first aspect of the present invention, there is provided a phase change magnetic composite material which comprises a phase change material component, and a ferromagnetic material component. This material has a crystalline phase associated therewith a first magnetic property and a first phase change material property. In addition, this material has an amorphous phase associated therewith a second magnetic property and a second phase change material property. The material of the invention has unique electrical, magnetic, thermal, crystallization and optical properties at different phases, such as fully crystalline states, amorphous, and partial crystalline phases. The material exhibits both magnetic effects and phase change effects and can be used in a wide range of applications. Examples of applications in which the material may be used include, but are not restricted to, optical media, phase change random access memory (PCRAM) devices, magnetic random access memory (MRAM) devices, solid state memory devices, sensor devices, logical devices, cognitive devices, artificial neuron network, three level devices, control devices, SOC devices and semiconductors.

According to another aspect of the invention, there is provided an optical recording medium for recording information, said medium comprising the phase change magnetic material of the invention. The invented material has different electrical, magnetic, and optical properties at different phase states, such as crystalline states, amorphous, and partial crystalline. The invention further relates to the uses of the phase change magnetic material in devices such as solid state memory devices, semiconductors, logical devices, magnetic random access memory, artificial neuron network, and phase change random access memory devices.

These aspects and other aspects of the invention will be more fully understood in view of the following description, drawings and non-limiting examples.

BRIEF DESCRIPTION OF THE DRAWINGS

As shown in FIGS. 2(a-d), conventional phase change materials exhibits antimagnetic property while phase change magnetic material according to the present invention shows magnetic property.

FIG. 5 shows a table of data comparing the electrical resistivity of conventional phase change materials and the phase change magnetic material of the invention at amorphous and crystalline states. The data shows that phase change magnetic material according to the invention have similar electrical properties to phase change materials.

DETAILED DESCRIPTION

Figure 1:
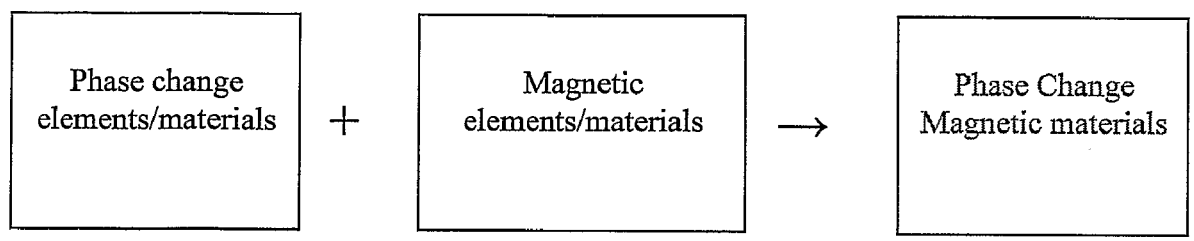
FIG. 1 is a schematic diagram showing the synthesis of phase change magnetic material according to one embodiment of the present invention.
Figure 2A:
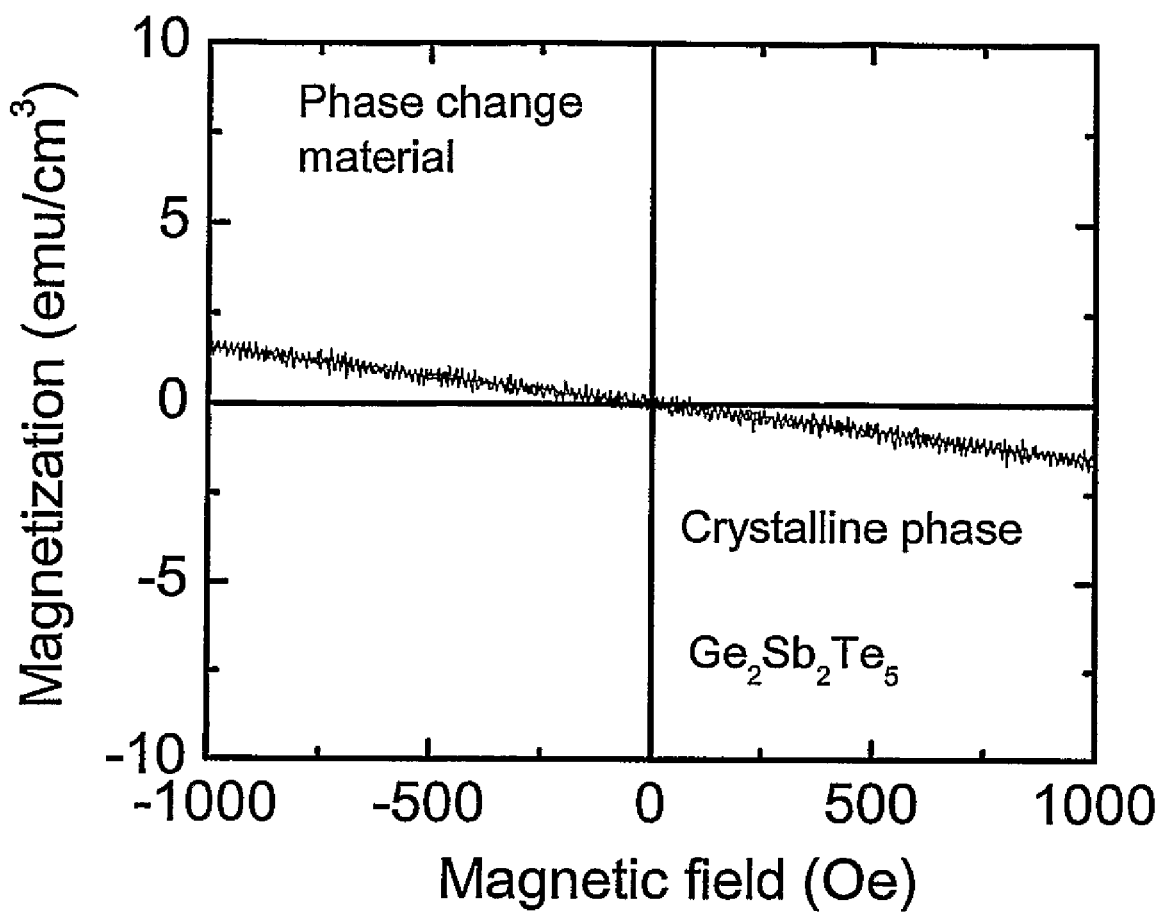
FIG. 2a shows graphical data characterising the magnetic properties of a conventional phase change material $Ge_2Sb_2Te_5$; as can be seen from the figure, the material exhibits antimagnetic properties.
Figure 2B:
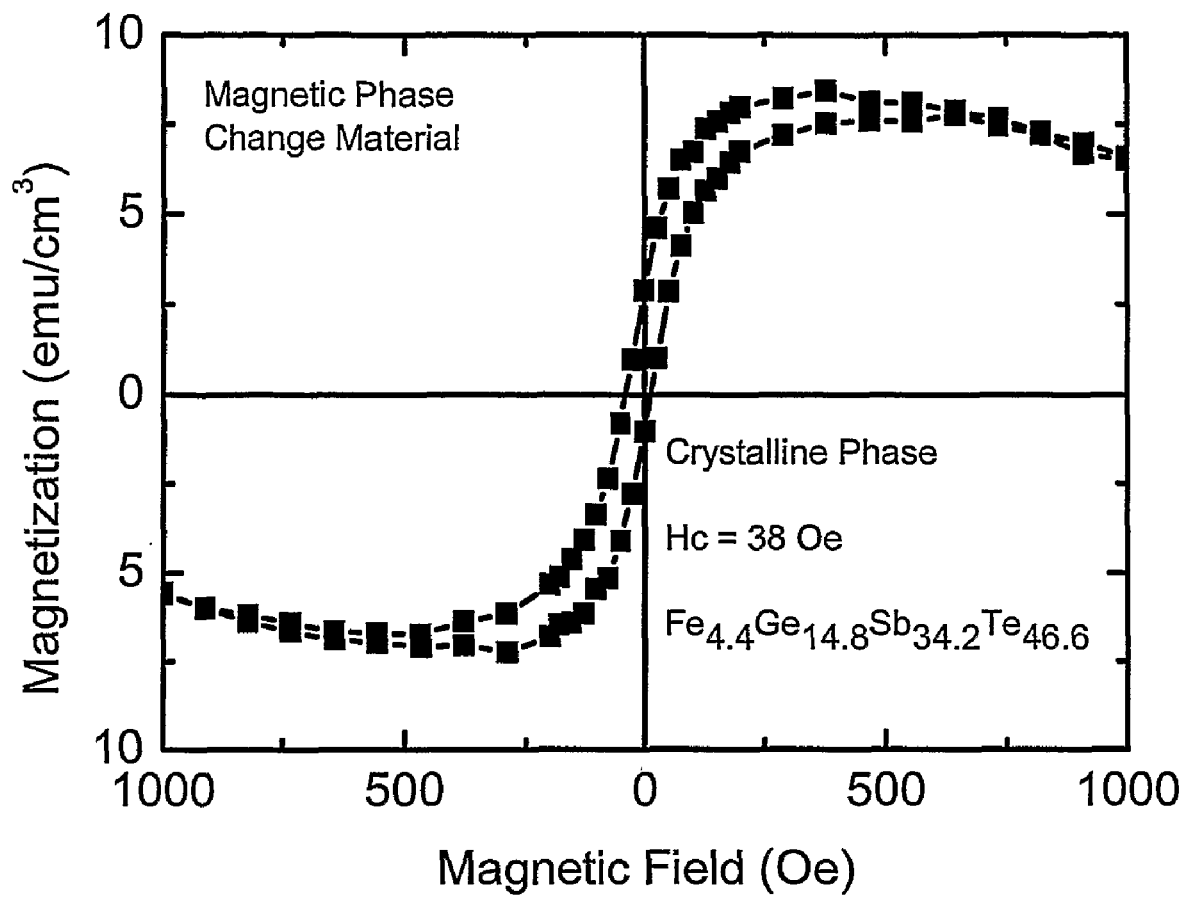
FIG. 2b shows graphical data characterising the magnetic properties of a phase change magnetic material, $Fe_{4.4}Ge_{14.8}Sb_{34.2}Te_{46.6}$ according to one embodiment of the invention. Coercivity value $H_c$ of 38 Oersteds is observed at zero magnetization.
Figure 2C:
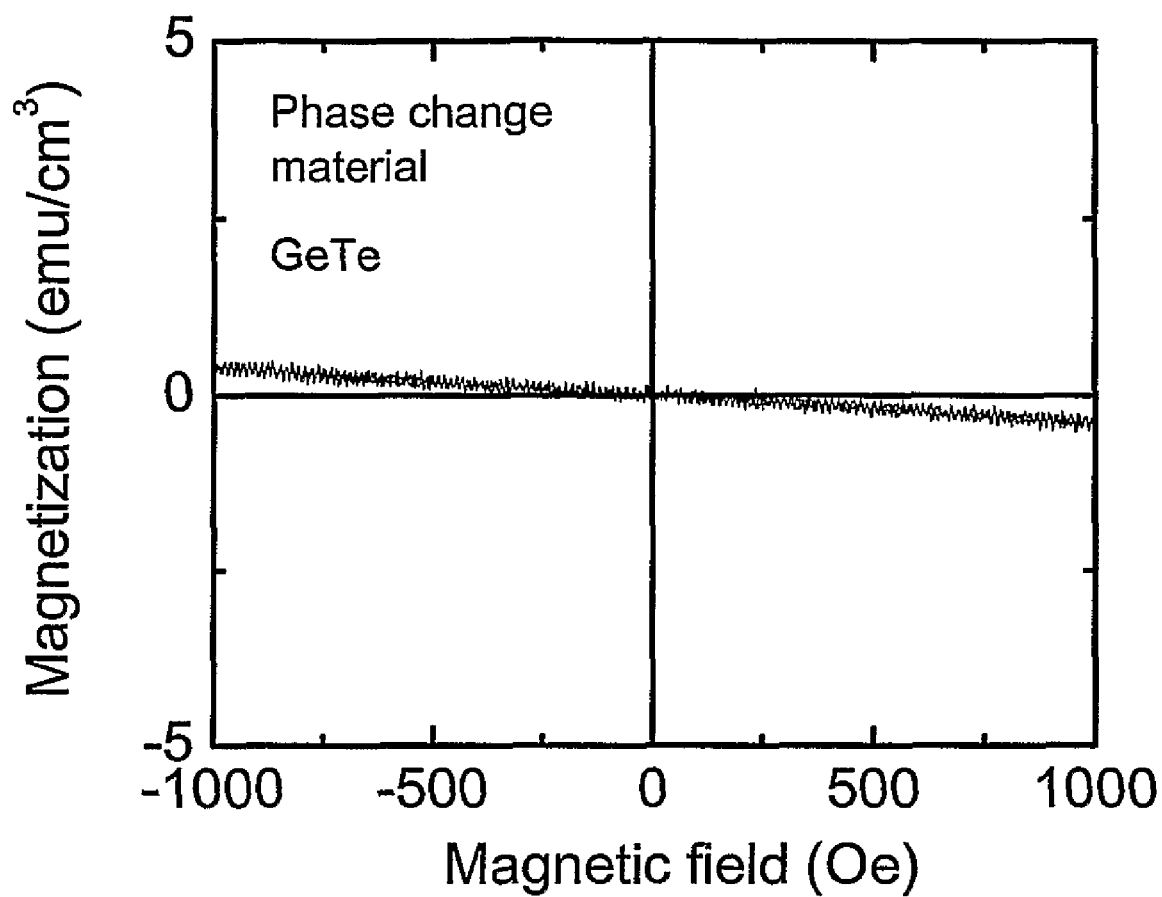
FIG. 2c shows graphical data characterising the magnetic properties of phase change material of GeTe.
Figure 2D:
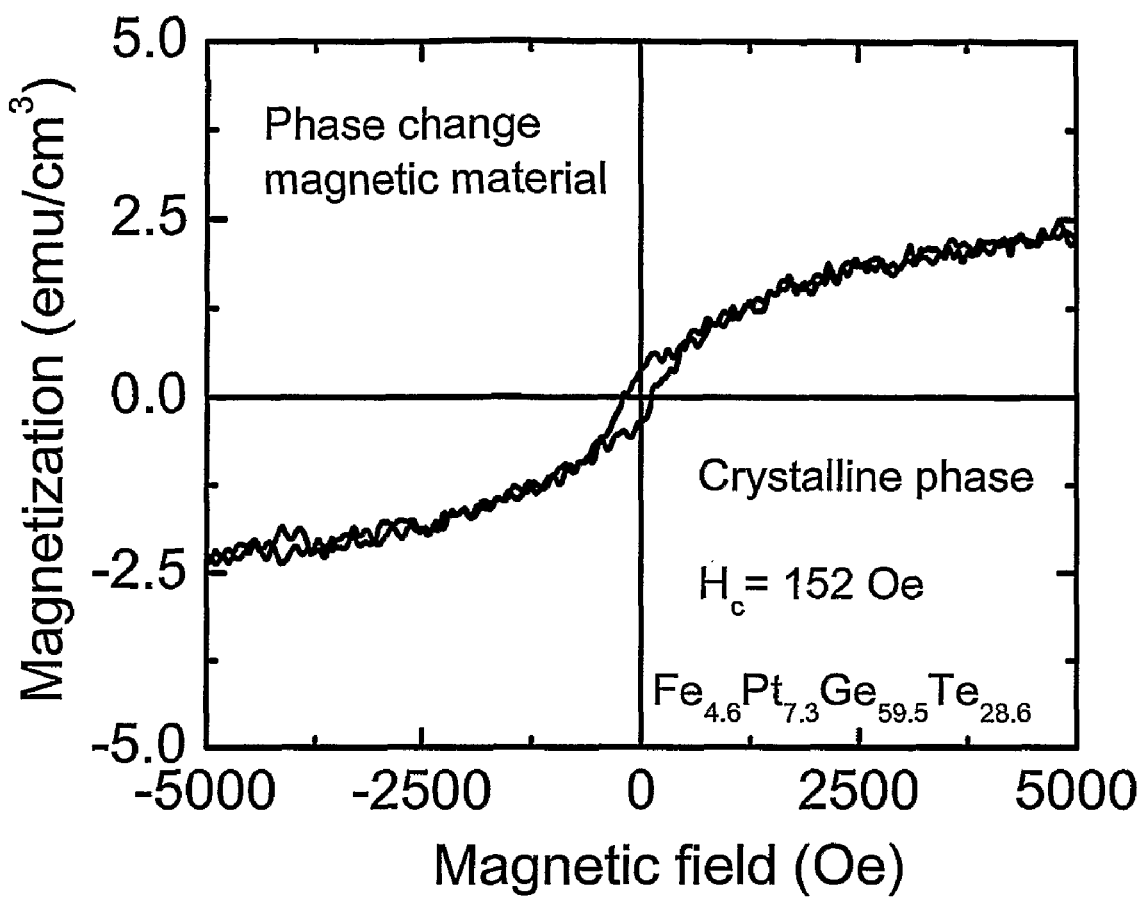
FIG. 2d show magnetic properties of phase change magnetic material of $Fe_{4.6}Pt_{7.3}Ge_{59.5}Te_{28.6}$ according to the present invention.

The invention is based on the finding that phase change materials and magnetic materials can be used to form a homogeneous composite material that exhibits both phase change effects as well as magnetic effects. In the context of the present invention, a material is said to exhibit phase change effects if it shows changes in its physical properties when it undergoes a phase change. Examples of these physical properties include resistivity, absorption at different wavelength, optical constants, dispersion relation, dielectric constants, density, thermal conductivity, thermal diffusion coefficient, specific heat, active energy, lattice constant, crystallization temperature, glass temperature. Likewise, a material is said to exhibit magnetic effects if it is under a magnetic field.

Without wishing to be bound by theory, the inventors presently believe that under appropriate growth conditions, phase change components and magnetic components can be combined such that the crystal structure of the resulting phase change magnetic material is altered: some of the atoms of the phase change material is replaced by the atoms of magnetic material in the crystal structure, so a new unit cell having a unique crystal structure is formed. In other words, atoms of magnetic material are made to replace the positions of some atoms of phase change material, without destroying crystal structure of phase change material. In this manner, phase change magnetic composite materials are able to exhibit both phase change effects due to similar crystal structure with phase change material, and magnetic effects due to magnetic atoms existing in the crystal structure.

One advantage that is provided by the material of the invention is that each phase of the material is coupled to a unique set of phase change properties and magnetic properties. This means that when the material undergoes phase change from crystalline phase to amorphous phase, for instance, the material exhibits a corresponding change in both its phase change properties (e.g. optical reflectance, optical constants) and its magnetic properties (e.g. field strength). The benefit of dual property change can be harnessed for a wide variety of applications, such as sensing, data storage, logical, cognitive, control, SOC (system on chip) and semiconductor applications. For recording applications for instance, this property enables the readout signal from the contribution of both the optical reflectance change, polarization, frequency and magnetic change to be detected at the same time and at the same point, thereby increasing the recording density and data transfer rate in recording media utilising the material of the invention. In sensing applications, this property enables sensing measurements to be highly accurate for electric, thermal, optical, magnetic, magneto-optical, thermal-electric, electric-optical and their combination.

Phase change properties exhibited by the phase change magnetic material (hereinafter referred to as "PCM material") of the present invention include the properties of high electrical resistivity, low thermal conductivity, and low light reflectivity in the amorphous phase, and low electrical resistivity, high thermal conductivity and high light reflectivity in the crystalline phase. The physical parameters such as resistivity, reflectivity, absorption, optical constants, refraction index and absorption coefficient, dielectric constants, density, thermal conductivity, thermal diffusion coefficient, specific heat, active energy, and so on are different at partial crystalline states ranging from those at the amorphous state to those at the crystalline state. These properties are similar to those exhibited by known phase change materials and are thus presently known as phase change effects.

Magnetic properties (hereinafter used interchangeably with the term "magnetic effects") exhibited by the material include having paramagnetic properties in the amorphous (disordered) phase and magnetic properties in the crystalline (ordered) phase. Magnetic effects also include changes of magnetic properties such as the saturation magnetization Ms, coercive field Hc, anisotropy field $H_k$, uniaxial anisotropy constant Ku, squareness, remanence magnetization Mr, saturation induction Bs, Curie temperature Tc, compensation temperature and so on. These properties are similar to those exhibited by magnetic materials and are thus presently known as magnetic effects.

The phase change magnetic composite material of the invention comprises two main components, namely a phase change component and a magnetic component.

The phase change component comprises any type of phase change material. It is preferable in some embodiments that the phase change material exhibits phase change (i.e. it may melt) at a temperature above standard room temperature (i.e. 25° Celsius), or more preferably, at an elevated temperature of more than a hundred, or more than several hundred degrees Celsius. The elevated temperature can be brought about by any suitable focussed laser beam or any electric current or heating device. For recording purposes, the phase change material preferably changes from the crystalline phase to the amorphous phase upon heating and subsequent cooling, and does not regain the crystalline conformation. In this manner, the amorphous marks in combination with the crystalline areas may be used to represent data. It is possible to also use phase change materials in which phase change occurs at temperatures higher than the temperatures that can be provided by standard laser equipment. If used, such materials require higher operating power in order to induce the phase change. On the other hand, phase change materials such as paraffin wax and polyimides (e.g. polymeric organic substances) which are used for thermal insulation of buildings, for example, are not considered to be suitable for use in the invention due to the relatively low phase change temperature.

In one embodiment, the phase change component is selected from an element from any of the Groups IIIB, IVB, VB and VIB of the Periodic Table. In some embodiments, preferred elements are selected from, but are not restricted to, the chalcogen elements Te, S, Po and Se, as well as other elements such as P, As, Sb, Bi, Ge, Sn, Pb, Ga, In, and Ti.

In a presently preferred embodiment, the phase change component comprises a chalcogenide alloy. Examples of suitable secondary, ternary and quaternary chalcogenide alloy systems include, but are not limited to, Ge—Te, Sb—Te, Ge—Sb, Sn—Te, Sb—Se, In—Se, Ge—Sb—Te, Pt—Ge—Te, In—Sb—Te, As—Sb—Te, As—Ge—Te, Se—Sb—Te, Sn—Te—Se, Ge—Te—Sn, Sb—Se—Bi, Ga—Te—Se, In—Se—Ti, Ge—Te—Ti, Ge—Te—Sn—O, Ge—Te—Sn—Au, Ge—Te—Sn—Pd, Ag—In—Sb—Te and mixtures thereof. Presently preferred quaternary systems include Ge—Sb—Te—X and In—Sb—Te—X wherein X is a transition metal such as Au, Pd, Ir, Ru, Re, Mo, Ta, Zr and La. Each element in these presently preferred alloy systems can be present in any suitable atomic percentage. Some examples of presently preferred alloy compositions include, but are not limited to, $Ge_2Sb_2Te_5$, $GeSb_2Te_4$, $GeSb_3Te_4$, $GeSb_4Te_7$, $In_3SbTe_2$, $Ag_5In_5Sb_{60}Te_{30}$, $Sb_2Te_3$, $Sb_{70}Te_{30}$, GeTe, GeSb, $Sb_2Se_3$, $Sb_2Te_3$—GeTe, for instance.

The second component present in the phase change magnetic material of the invention is a ferromagnetic component. The term "ferromagnetic component" refers to materials having a large and positive susceptibility to an external magnetic field. Typically, such materials have unpaired electrons whose spins results in a net magnetic moment to be generated in each atom of the ferromagnetic material. The electron spins of the atoms are aligned in microscopic regions known as domains. In these domains, large numbers of atoms (typically about $10^{12}$ to $10^{15}$) are aligned in parallel so that the magnetic force within the domain is strong. When a ferromagnetic material is in the unmagnetized state, the domains are nearly randomly organized and the net magnetic field for the part as a whole is zero. When the ferromagnetic material is brought within the influence of a magnetic field, the domains become aligned with the magnetic field, thereby producing a strong magnetic field within that part of the material.

In one embodiment, the ferromagnetic component that is used in the present invention is selected from, but not limited to, the elements iron, nickel, and cobalt. Further examples include ferromagnetic alloys comprising at least one ferromagnetic component, such as such iron, nickel, and cobalt. Examples of ferromagnetic alloys comprising at least one ferromagnetic component includes FePt, CoPt, PdCo, TbFeCo, GdFeCo, CoCrPtB, and CoCrPtTa, to name only a few.

When the material of the invention is used in a conventional recording medium such as compact discs, digital video disc, and magnetic media systems, the proportion of each of the phase change component and the magnetic component is selected such that the resulting material possesses characteristics or exhibits properties that are desirable in conventional phase change media, conventional magnetic media and as well as conventional magneto-optical media, so that the medium is able to function according to the requirements of standard reading and recording equipment. To achieve this purpose, the components of the phase change magnetic material can be selected such that the composite material exhibits at least one physical state selected from a crystalline state, an amorphous state and a partial crystalline state. The components of the phase change magnetic material can also be selected such that the composite material exhibits different electrical, magnetic, thermal, crystallization, and optical properties at each of said at least one physical state.

Desirable characteristics in a phase change optical media includes different refractive indexes for the crystalline and amorphous phases (for optical contrast), low melting point (for low laser power), high crystallization speed and good amorphous stability. Desirable characteristics in a magnetic media includes perpendicular magnetic anisotropy (for facilitating perpendicular magnetic recording), small grain size, high perpendicular coercivity, high perpendicular anisotropy, high squareness, proper saturation magnetization. Desirable characteristics in a magneto-optical media includes an amorphous structure (for smooth surface and domain's boundaries to decrease system's noise), suitable Curie temperature (for media stability and low laser power), rapid drop of coercivity near the Curie temperature (for sharp recording threshold), perpendicular magnetic anisotropy, chemical stability (for constant material's properties under repeated heating-cooling) and high coercivity at room temperature (for media stability, accidental data loss prevention). Accordingly, in one embodiment, the components of the material are selected to achieve at least one of the above properties.

In one embodiment, the phase change component and ferromagnetic component are present in a proportion such that the resulting phase change material has a crystalline phase associated therewith a first magnetic property and a first phase change property, and an amorphous phase associated therewith a second magnetic property and a second phase change property. The proportion of each component present in the material should enable the second set of magnetic and phase change properties to be distinct and different from the first set properties, thereby enabling these properties to be used for representing recorded information on the material.

In some embodiments, the resistivity ρ of said material is generally in the range of $1\times10^{-3}$ Ωcm<ρ<$1\times10^{3}$ Ωcm, or 0.1 Ωcm<ρ<10 Ωcm at amorphous state and in the range of $1\times10^{-4}$ Ωcm<ρ<$1\times10^{-1}$ Ωcm, or $1\times10^{-7}$ Ωcm<ρ<$1\times10^{-2}$ Ωcm at crystalline state. The resistivity difference of said material between the amorphous phase and the crystalline phase by at least about a factor of 2 to $10^6$. In other preferred embodiments, the coercivity of the material in the crystalline phase is at least about 1 Oersted, or in some cases, at least about 40 Oersteds.

In a further embodiment, the phase change magnetic material has a crystal structure that is at least substantially similar to the phase change material component. In this embodiment, the atoms of magnetic materials replace the position of some atoms of phase change materials without destroying crystal structure of phase change materials. As the atoms of magnetic elements or materials replace the positions of some atoms of phase change material to form a new unit cell with unique crystal structure under appropriate growth conditions and the replacement is in a certain range of replacement, these materials exhibit both phase change effect and magnetic effect.

In a further embodiment, the phase change magnetic material has a composition of formula (I):

$$A_xB_y$$

wherein

A denotes the ferromagnetic component;

B denotes the phase change component;

x denotes the total atomic percentage of A, wherein 1%≦x≦50%, and y denotes the total atomic percentage of B, wherein 50%≦y≦99%.

In one presently preferred embodiment, the phase change magnetic material as defined in formula (I) has a ferromagnetic component A selected from any of the elements Co, FeNi and the alloy FePt, and a phase change component B selected from Sb, Te, GeTe, $Sb_2Te_3$, GeSb, $Sb_{70}Te_{30}$, InSbTe, Ag—In—Sb—Te and Ge—Sb—Te. The chemical formula of composite materials having the formula (I) may be selected from one of the following simplified chemical formula: $Fe(Sb_2Te_3)$, $Co(Sb_2Te_3)$, $Ni(Sb_2Te_3)$, FeGeSb, CoGeSb, NiGeSb, $Fe(Sb_{70}Te_{30})$, $Co(Sb_{70}Te_{30})$, $Ni(Sb_{70}Te_{30})$, FeInSbTe, CoInSbTe, and NiInSbTe. Illustrative examples include, but are not limited to, $Co_{6.3}Ge_{31.1}Sb_{27.1}Te_{35.5}$, $Co_{3.6}Ge_{20.8}Sb_{30.5}Te_{44.9}$, $Co_{2.8}Ge_{17.9}Sb_{31.9}Te_{47.1}$, $Co_{6.1}Ge_{14.3}Sb_{33}Te_{46.5}$, $Co_{3.0}Ge_{18.5}Sb_{30.1}Te_{48.2}$, $Co_{5.0}Ge_{16.9}Sb_{31.6}Te_{46.5}$, $Co_{1.5}Ge_{17.3}Sb_{32.9}Te_{48.3}$, $Co_{5.4}Ge_{17.2}Sb_{30.5}Te_{46.9}$, $Co_{2.0}Ge_{17.7}Sb_{32.5}Te_{47.8}$, $Co_{5.8}Ge_{17.1}Sb_{32.3}Te_{44.8}$, $Co_{4.6}Ge_{14.9}Sb_{33.4}Te_{47.1}$, $Co_{10.1}Ge_{14.4}Sb_{34.6}Te_{40.9}$, $Co_{26.1}Ge_{17.2}Sb_{22.1}Te_{34.6}$, $Co_{5.6}Ge_{15.8}Sb_{33.6}Te_{45}$, $Fe_{20.2}Ge_{21.5}Sb_{16.9}Te_{41.4}$, $Fe_{9.2}Ge_{16.3}Sb_{27.4}Te_{47.2}$, $Fe_{4.7}Ge_{18.5}Sb_{28.1}Te_{48.6}$, $Fe_{4.4}Ge_{14.8}Sb_{34.2}Te_{46.6}$, $Fe_{11.1}Ge_{16}Sb_{25.9}Te_{47.1}$, $Fe_{1.0}Ge_{15.7}Sb_{35.2}Te_{48.2}$, $Fe_{7.2}Ge_{14.7}Sb_{32.9}Te_{45.2}$, $Fe_{28.2}Pt_{32.4}Ge_{30.0}Te_{9.3}$, $Fe_{4.1}Pt_{4.2}Ge_{64.5}Te_{27.1}$, $Fe_{2.1}Pt_{5.5}Ge_{63.9}Te_{28.4}$, $Fe_{1.1}Pt_{2.7}Ge_{64.3}Te_{31.9}$, $Fe_{4.6}$  $Pt_{7.3}Ge_{59.5}Te_{28.6}$, $Fe_{5.0}$ $Pt_{6.8}Ge_{59.6}Te_{28.6}$, $Fe_{1.1}Pt_{1.1}Ge_{50.4}Te_{31.1}$, $Fe_{4.8}$ $Pt_{4.6}Ge_{58.2}Te_{32.4}$, and $Fe_{1.2}Pt_{2.5}Ge_{54.2}Te_{41.9}$, $Fe_{1.0}Pt_{2.0}Ge_{62.1}Te_{34.9}$.

In a further embodiment, the phase change magnetic material has a composition of formula (II):

$$A_xB_yC_z$$

wherein

A denotes a ferromagnetic component;

B denotes a phase change component;

C denotes a manganese compound component;

x denotes the total atomic percentage of A, wherein 1%≦x≦40%, y denotes the total atomic percentage of B, wherein 40%≦y≦98%, and z denotes the total atomic percentage of C, wherein 1%≦y≦20%.

In one presently preferred embodiment, the phase change magnetic material as defined in formula (II) has a ferromagnetic component A selected from any of the elements Co, FeNi and the alloy Fe—Pt, and a phase change component B selected from Sb, Te, GeTe, $Sb_2Te_3$, GeSb, $Sb_{70}Te_{30}$, InSbTe, Ag—In—Sb—Te and Ge—Sb—Te. The third component C is selected from MnAs, MnGa, MnSb, and MnAl. Components A and B of presently preferred composite materials having the formula (II) are presently preferably combined to form one of the following compounds: $Fe(Sb_2Te_3)$, $Co(Sb_2Te_3)$, $Ni(Sb_2Te_3)$, FeGeSb, CoGeSb, NiGeSb, $Fe(Sb_{70}Te_{30})$, $Co(Sb_{70}Te_{30})$, $Ni(Sb_{70}Te_{30})$, FeInSbTe, CoInSbTe, and NiInSbTe. Illustrative examples include, but are not limited to, $Co_{6.3}Ge_{31.1}Sb_{27.1}Te_{35.5}$, $Co_{3.6}Ge_{20.8}Sb_{30.5}Te_{44.9}$, $Co_{2.8}Ge_{17.9}Sb_{31.9}Te_{47.1}$, $Co_{6.1}Ge_{14.3}Sb_{33}Te_{46.5}$, $Co_{3.0}Ge_{18.5}Sb_{30.1}Te_{48.2}$, $Co_{5.0}Ge_{16.9}Sb_{31.6}Te_{46.5}$, $Co_{1.5}Ge_{17.3}Sb_{32.9}Te_{48.3}$, $Co_{5.4}Ge_{17.2}Sb_{30.5}Te_{46.9}$, $Co_{2.0}Ge_{17.7}Sb_{32.5}Te_{47.8}$, $Co_{5.8}Ge_{17.1}Sb_{32.3}Te_{44.8}$, $Co_{4.6}Ge_{14.9}Sb_{33.4}Te_{47.1}$, $Co_{10.1}Ge_{14.4}Sb_{34.6}Te_{40.9}$, $Co_{26.1}Ge_{17.2}Sb_{22.1}Te_{34.6}$, $Co_{5.6}Ge_{15.8}Sb_{33.6}Te_{45}$, $Fe_{20.2}Ge_{21.5}Sb_{16.9}Te_{41.4}$, $Fe_{9.2}Ge_{16.3}Sb_{27.4}Te_{47.2}$, $Fe_{4.7}Ge_{18.5}Sb_{28.1}Te_{48.6}$, $Fe_{4.4}Ge_{14.8}Sb_{34.2}Te_{46.6}$, $Fe_{11.1}Ge_{16}Sb_{25.9}Te_{47.1}$, $Fe_{1.0}Ge_{15.7}Sb_{35.2}Te_{48.2}$, $Fe_{7.2}Ge_{14.7}Sb_{32.9}Te_{45.2}$, $Fe_{28.2}Pt_{32.4}Ge_{30.0}Te_{9.3}$, $Fe_{4.1}$  $Pt_{4.2}Ge_{64.5}Te_{27.1}$, $Fe_{2.1}Pt_{5.5}Ge_{63.9}Te_{28.4}$, $Fe_{1.1}Pt_{2.7}Ge_{64.3}Te_{31.9}$, $Fe_{5.0}Pt_{6.8}Ge_{59.6}Te_{28.6}$, $Fe_{4.6}Pt_{7.3}Ge_{59.5}Te_{28.6}$, $Fe_{1.1}Pt_{1.1}Ge_{50.4}Te_{31.1}$, $Fe_{4.8}$ $Pt_{4.6}Ge_{58.2}Te_{32.4}$, $Fe_{1.2}Pt_{2.5}Ge_{54.2}Te_{41.9}$, and $Fe_{1.0}Pt_{2.0}Ge_{62.1}Te_{34.9}$.

It would be understood by a person skilled in the art that the phase change magnetic material of the invention can be used in conjunction with any suitable type of secondary material known in the art which aids in the optical media, phase change random access memory (PCRAM) devices, magnetic random access memory (MRAM) devices, solid state memory devices, sensor devices, logical devices, cognitive devices, artificial neuron network, and semiconductors of the material of the invention. Secondary materials include dyes for improving reflectivity, sacrificial coatings for preventing moisture degradation, for example.

In order for both phase change effects and magnetic effects to be exhibited in the material, the phase change component and the ferromagnetic component may be present in the material according to a suitable ratio which allows the atoms of the magnetic material to replace the atoms of the phase change material without resulting in any substantial change in the crystal structure of the phase change material Many methods are suitable for the synthesis of the phase change magnetic material of the invention. Examples of methods which enable a homogeneous composite material to be formed and can thus be used herein, include laser ablation, sputtering, ion plating, chemical vapor deposition (CVD), plasma enhanced chemical vapor, metal organic chemical vapor deposition, spin coating, molecular beam epitaxy (MBE), top-seeded solution growth, thermal pressing, vacuum melting, and conventional crystal growth.

In one embodiment, the material of the invention is synthesized by laser ablation or by laser synthesis. Preferably, the material is synthesised via laser synthesis. In the context of the present invention, the method of synthesis involving dual-beam laser ablation of different targets for synthesizing new materials within the overlapping plasma area is included in the term "laser synthesis". Laser synthesis is carried out by laser pulses from an excimer laser used to heat precursor component materials that are mounted onto rotating mounts. By positioning the mounts such that the plumes emitted from the precursors overlap at least partially, a substrate can be positioned within this overlapping region so that a homogeneous film can be formed thereon. This procedure is described, for example, by Song et al. (Appl. Phys. A. Vol. 79 p 1349-1352, 2004).

In another aspect, the invention relates to an optical recording medium for recording information, comprising a phase change magnetic material, said material comprising a phase change component and a ferromagnetic component, wherein said material exhibits both magnetic effect and phase change effect. The design of an optical disc as such and method of manufacturing an optical disc are known to the person of average skill in the art and described for example, in U.S. Pat. No. 6,469,977. Actual implementations of such an optical disc include CD-RW, DVD-RAM, DVD-RW, DVD+RW, Blu-ray, HD-DVD. Next generation products of optical discs including discs with holography recording, near field optical recording, multi layer optical recording and multi-level recording have been the subject of intense research in recent years. Other uses of the phase change magnetic material according to the invention include the use in phase change random access memory (PCRAM) devices, magnetic random access memory (MRAM) devices, solid state memory devices, sensor devices, logical devices, cognitive devices, three level device, control device, and semiconductors.

In actual use, an information recording medium which has a recording layer comprising the material of the invention is provided with the phase change magnetic material in either crystalline phase or in amorphous phase. During recording procedure, a laser selectively heats areas of a recording track present in the optical disc above the phase change magnetic material's melting point or crystallization temperature. The material is melted and subsequently 'frozen' by quickly cooling the layer or is crystallized. The reflectance of the amorphous areas is much different with that of the crystalline areas which, during readout, gives rise to a signal similar to that produced from the pits and lands of a ROM type disc. The change in optical reflectance can be used to represent stored data on the recording medium. A new overwriting signal can be recorded by erasing an existing recorded signal, using by modulating the laser output of the recording laser beam. During overwrite, some amorphous areas along the track are returned to the crystalline phase by annealing below the melting point with the use of a focussed laser beam, the material is locally heated to a temperature of approximately between the melting point and crystallisation temperature for a certain retention time in order to carry out re-crystallisation. Similarly, some crystalline areas are converted to the amorphous phase by heating above the melting point, then quenching as described above. This process can be repeated several thousand times per disc. For rewritable optical media, the background is in some cases preferably crystalline. The media using phase change magnetic material of the invention can also be made to be written once. For write once media or so-called "recordable media", the background of the disc can be either crystalline or amorphous.

At the same time, when the material is reversibly changed between amorphous and crystalline states, the magnetic properties of the material of the invention is correspondingly changed because of the structural change. Thus, this structural change can be detected by measuring the readout signal associated with the change in magnetic properties. Finally, the readout signal from the contribution of both the optical reflectance change and magnetic change is detected at the same time and at the same point. The recording density and data transfer rate will be increased. For conventional phase change media, only the optical reflectance change from the material can be detected. For the material of the invention, both the optical reflectance change and magnetic change can be detected at the same time and at the same point (location). The recording density and data transfer rate will be increased.

In utilising the magnetic properties of the material, conventional methods used for reading and writing magneto-optical discs can be carried out. For example, during reading, a laser projects a beam on the disk and the changes in the polarisation of reflected light is interpreted as binary data. The reflected light varies according to the magnetic data stored on the disc. The changes in light polarization occur due to the presence of a magnetic field on the surface of the disk (the Kerr effect). If a beam of polarized light is shone on the surface, the light polarization of the reflected beam will change slightly (typically less than 1°), provided it is reflected from a magnetized surface. If the magnetization is reversed, the change in polarization (the Kerr angle) is reversed as well. The magnetized areas—pits—cannot be seen in regular light, but only in polarized light. The change is direction of magnetization can be associated with numbers 0 or 1, thus allowing the storage of binary data. During recording, the light becomes stronger so it can heat the material up to the Curie point or compensation temperature in a single spot. This allows an electromagnet positioned on the opposite site of the disc to change the local magnetic polarization, and the polarization is retained when temperature drops. This fact that the material's coercivity drops at higher temperatures allows thermally-assisted magnetic recording to be carried out with relatively weak magnetic fields.

At the same time, when light polarization of the material changes because of the magnetization reversal, the structure the invented material is reversibly changed between amorphous and crystalline states, this change can be detected and a reflectance change is observed from the readout signal because of structural change. Finally, the combined readout signal from the contribution of both the light polarization change and optical reflectance change is detected at the same time and at the same point/location. The recording density and data transfer rate will be increased as a result. For conventional magneto-optical medium, only the light polarization change by magnetic reverse can be detected. For the material of the invention, both the light polarization change and optical reflectance change will be detected at the same time and at the same point. The recording density and data transfer rate is consequently increased.

EXAMPLE 1

Laser Synthesis

Synthesis Procedure

Figure 7A:
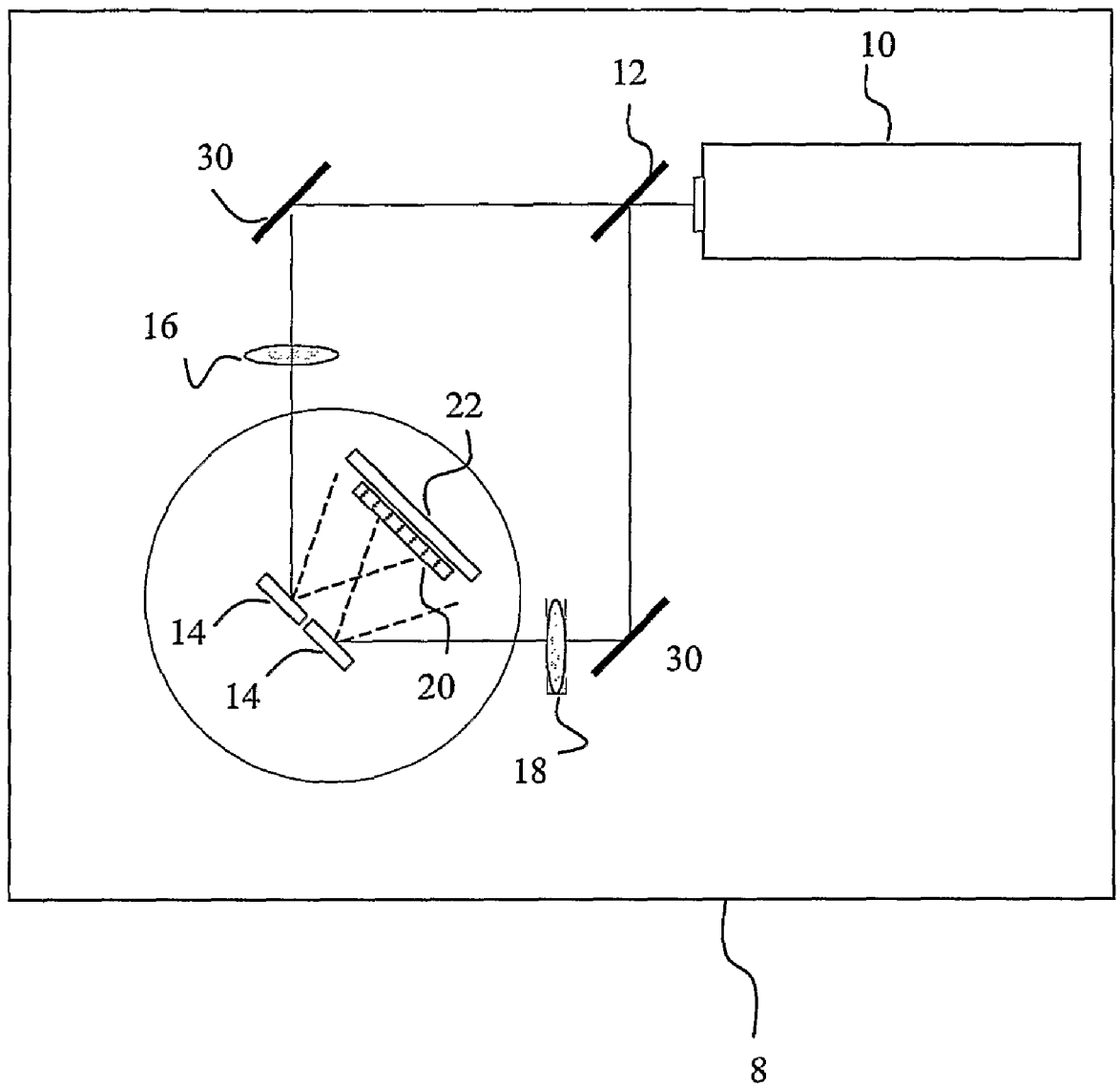
FIGS. 7a and 7b show schematic diagrams of a laser ablation system and a sputtering system, respectively, which can be used for synthesising the phase change magnetic material of the invention.

The schematic diagram of our laser synthesis system is shown in following FIG. 7(a). The synthesis was carried out in chamber 8. A KrF excimer laser beam from the laser 10 was split into two beams via splitter 12, and were focused onto two rotating targets 14 with two focus lenses 16, 18 and with the aid of two reflectors 30. Two overlapping plumes were produced on substrate 20, respectively. The laser fluence on each target is between 0.5 and 6 J/cm$^2$. The targets were mounted at 45° with respect to the laser beams. Facing the targets at a distance of 2 to 8 cm, substrate 20 was mounted on a two-inch stainless steel holder 22 by silver paste. The two mirrors is to reflect the splitted laser onto the focussing lens. A background pressure of $2\times10^{-6}$ Torr was achieved with a turbomolecular pump (not indicated). The growth temperature was between room temperature and 900° C. The synthesized materials were typically grown for 12000 pulses at a repetition rate of 10 Hz. After laser synthesis, the materials were cooled to room temperature.

In the context of the present invention, the method of synthesis involving dual-beam laser ablation of different targets for synthesizing new materials within the overlapping plasma area is termed "laser synthesis". In this method, the components including atoms, molecules, electrons, ions and clusters for material synthesis are highly energetic evaporants generated by laser ablation. The use of short laser pulses for ablation is more likely to achieve congruent ablation to preserve stoichiometry during mass transfer from target to substrate, which makes composition of new material easily controlled. Since laser interaction with gas-phase species is relative weak, many kinds of reactive gases can be input for material synthesis. It is flexible in tuning synthesized elements and composition by varying target, laser fluence and input gas as well as substrate position within the overlapping plasma area. A preferred single crystal substrate can be chosen to lead to crystal growth of new materials. It can also heat the substrate to high temperature to provide an appropriate environment for new material synthesis. The method is inexpensive, simple and fast to synthesize new materials.

According to the above experimental conditions, one target was selected from Fe, Co, FePt and another target was selected from $Ge_2Sb_2Te_5$ and GeTe. Three groups of phase change magnetic materials were synthesized. They comprised Co—Ge—Sb—Te, Fe—Ge—Sb—Te and Fe—Pt—Ge—Te systems. The composition of the materials produced were analysed by X-ray photoelectron spectroscopy (XPS). The crystal structures were analyzed by XRD. The magnetic, electrical and optical properties were all tested.

Figure 3A:
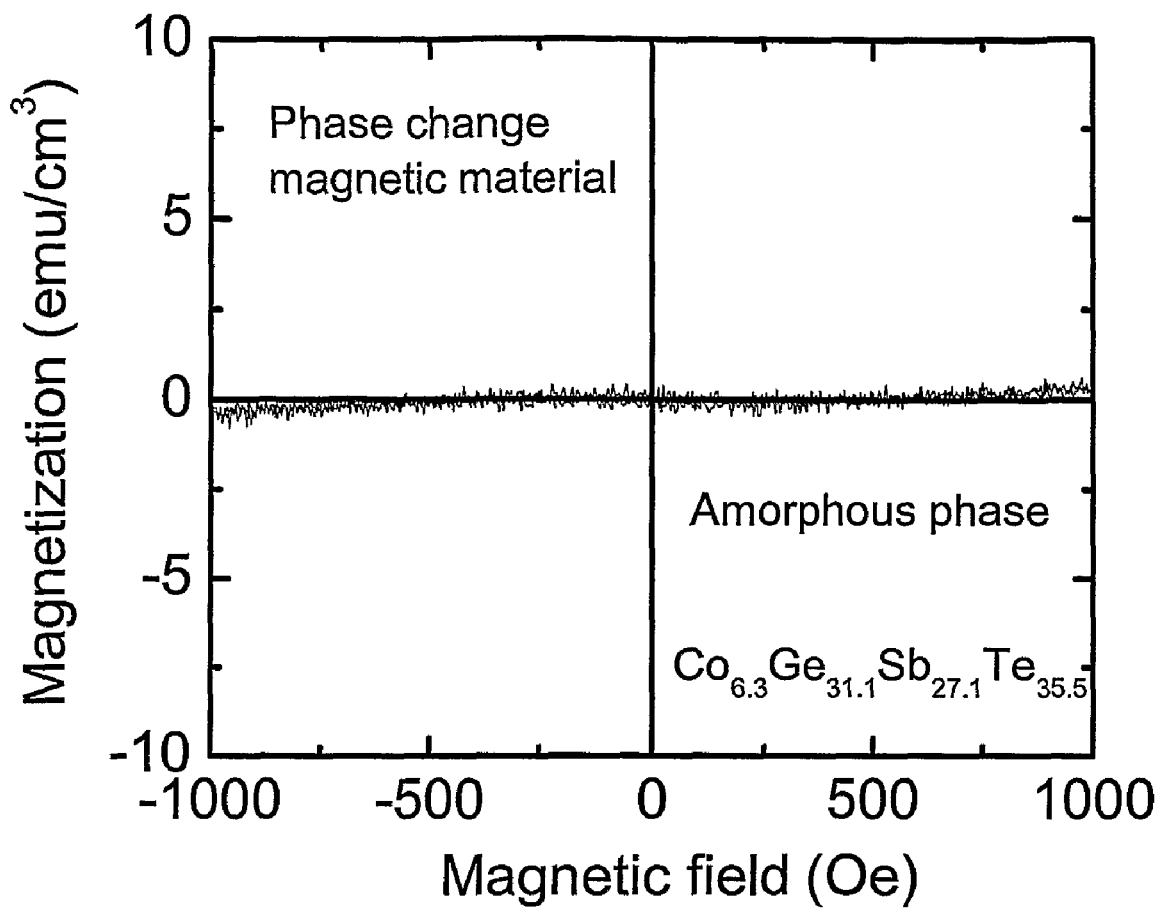
FIGS. 3a and 3b shows graphical data characterising the magnetic properties of the $Co_{6.3}Ge_{31.1}Sb_{27.1}Te_{35.5}$ in the amorphous and crystalline state.
Figure 3B:
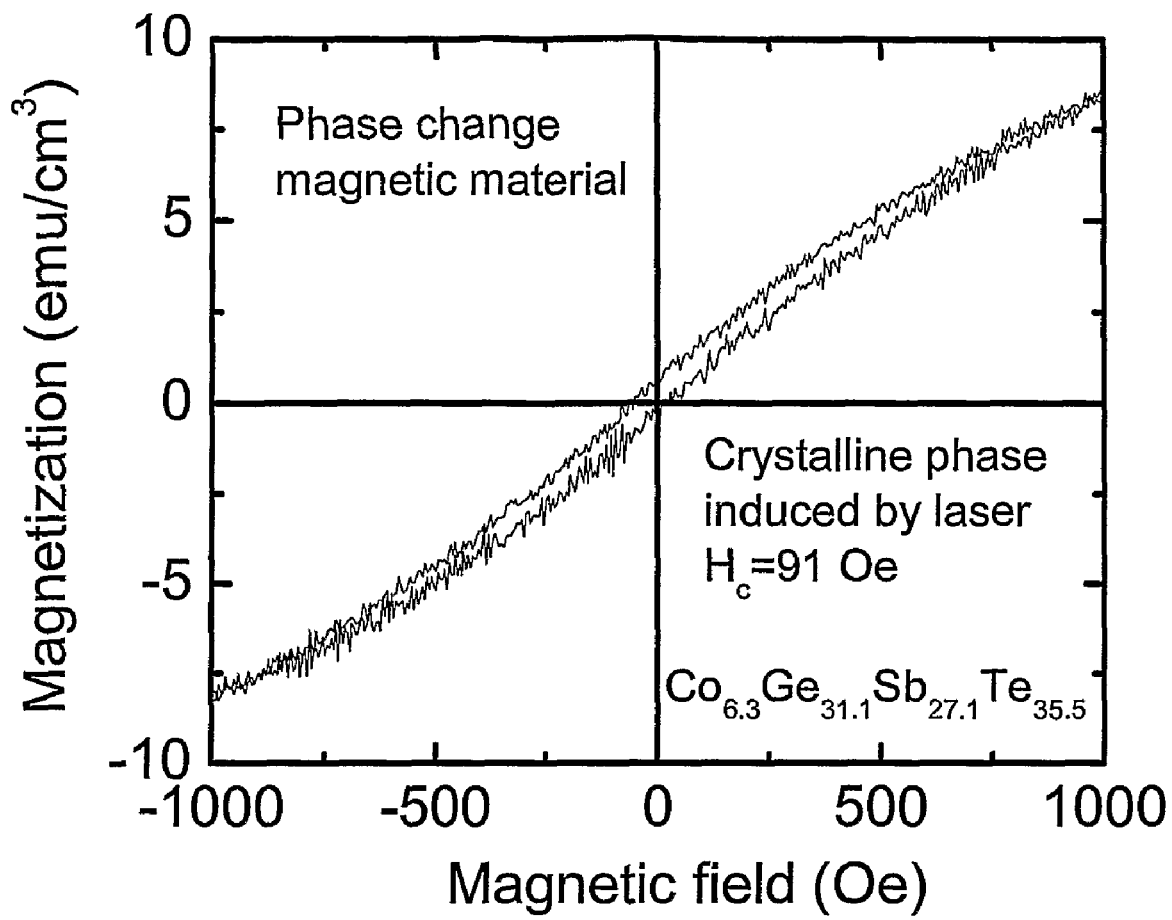

As shown in FIGS. 2a to 2d, a conventional phase change material such as $Ge_2Sb_2Te_5$ and GeTe exhibits antimagnetic property while phase change magnetic materials of the invention show magnetic property. In comparison, as shown in FIGS. 3a and 3b, the phase change magnetic material at crystalline state exhibits stronger magnetic property than the phase change magnetic material at amorphous state. This indicates that magnetic properties of phase change magnetic material vary with a state change of phase change magnetic material.

Figure 4:
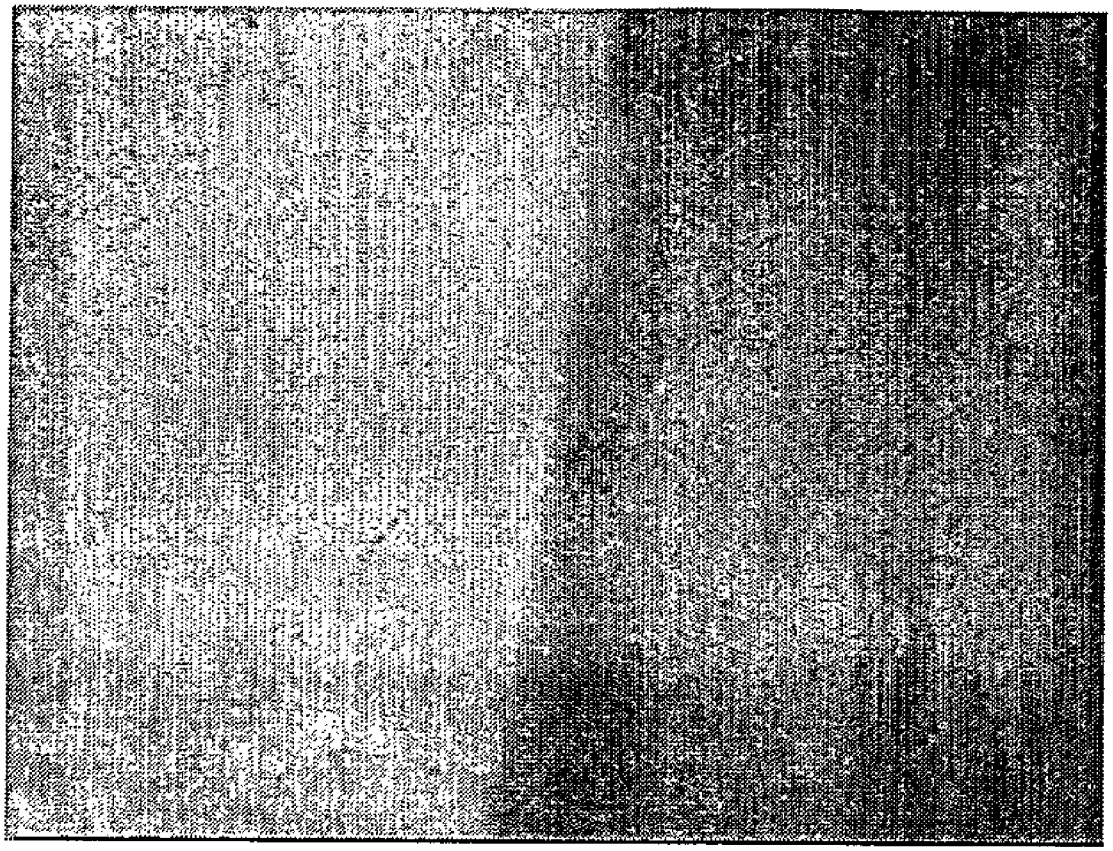
FIG. 4 is a microscope photograph of the material according to the invention at amorphous and crystalline phases as induced by a pulse laser. The photograph indicates that the phase change magnetic material has different optical properties in the amorphous and the crystalline phases, similar to phase change materials. The experiment also showed that between crystal and amorphous there are partial crystalline states meaning the crystalline fraction x is in the range, $0<x<1$.

FIG. 4 is a microscope photo showing contrast change between amorphous and crystalline phases induced by a pulse laser for the phase change magnetic material according to one embodiment of the present invention. It indicates that the phase change magnetic material has different optical properties between amorphous and crystalline phases, which is similar with phase change material.

FIG. 5 shows a table of data comparing the electrical resistivity of conventional phase change material and the phase change magnetic material according to one embodiment of the present invention at amorphous and crystalline states. It indicates both the phase change material and the phase change magnetic material exhibit relatively large differences in electric properties between amorphous state and crystalline state. This means that phase change magnetic material has a similar electric property with conventional phase change material.

In summary, phase change magnetic materials of the invention not only display characteristics of conventional phase change materials, but also magnetic properties and characteristics of magnetic semiconductor materials.

Figure 6A:
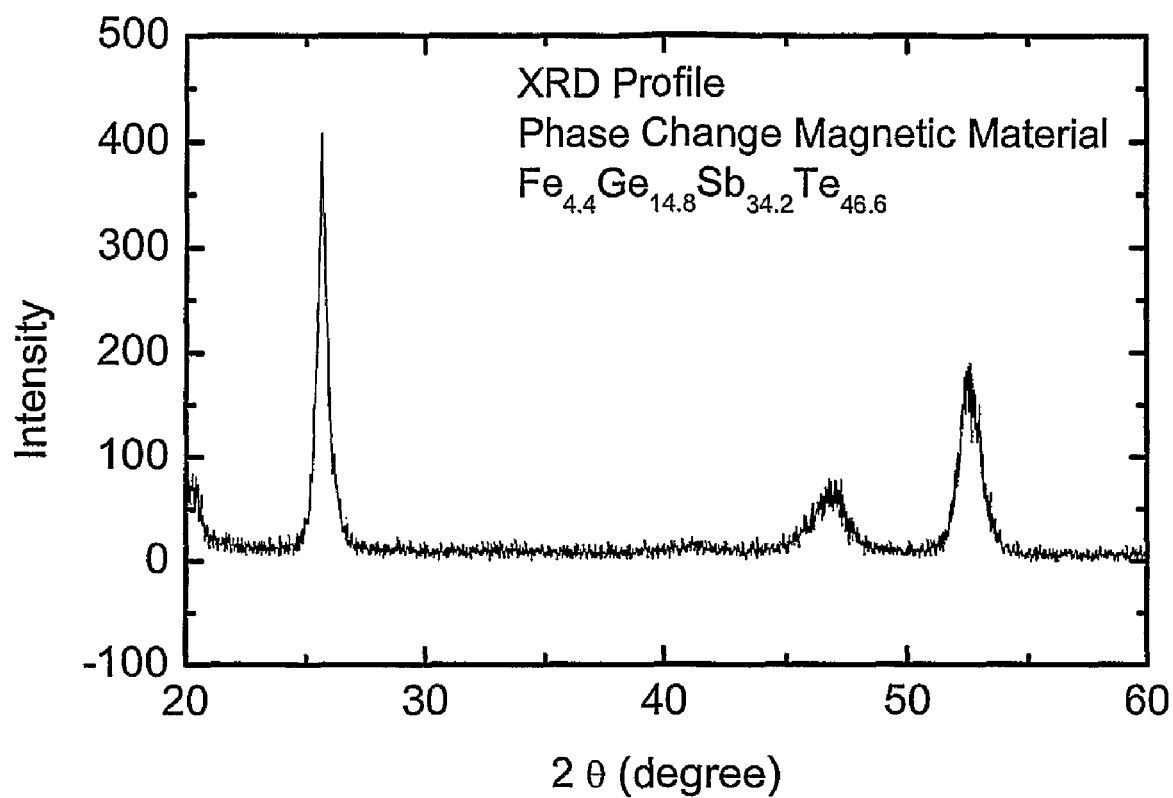
FIGS. 6a and 6b show XRD profiles characterising the crystal structure of 2 different phase change magnetic materials, namely, $Fe_{4.4}Ge_{14.8}Sb_{34.2}Te_{46.6}$ and $Fe_{4.6}Pt_{7.3}Ge_{59.5}Te_{28.6}$.

FIG. 6a shows the XRD profile characterising the crystal structure of a sample $Fe_{4.4}Ge_{14.8}Sb_{34.2}Te_{46.6}$. As can be seen from the figure, the material exhibited crystalline peaks, thus confirming the existence of a crystalline phase for a Fe—Ge—Sb—Te system synthesised at 300° C. An analysis of the peak position identified that the crystal structure of the synthesised $Fe_{4.4}Ge_{14.8}Sb_{34.2}Te_{46.6}$ to be similar to the crystal structure of $Ge_2Sb_2Te_5$.

Figure 6B:
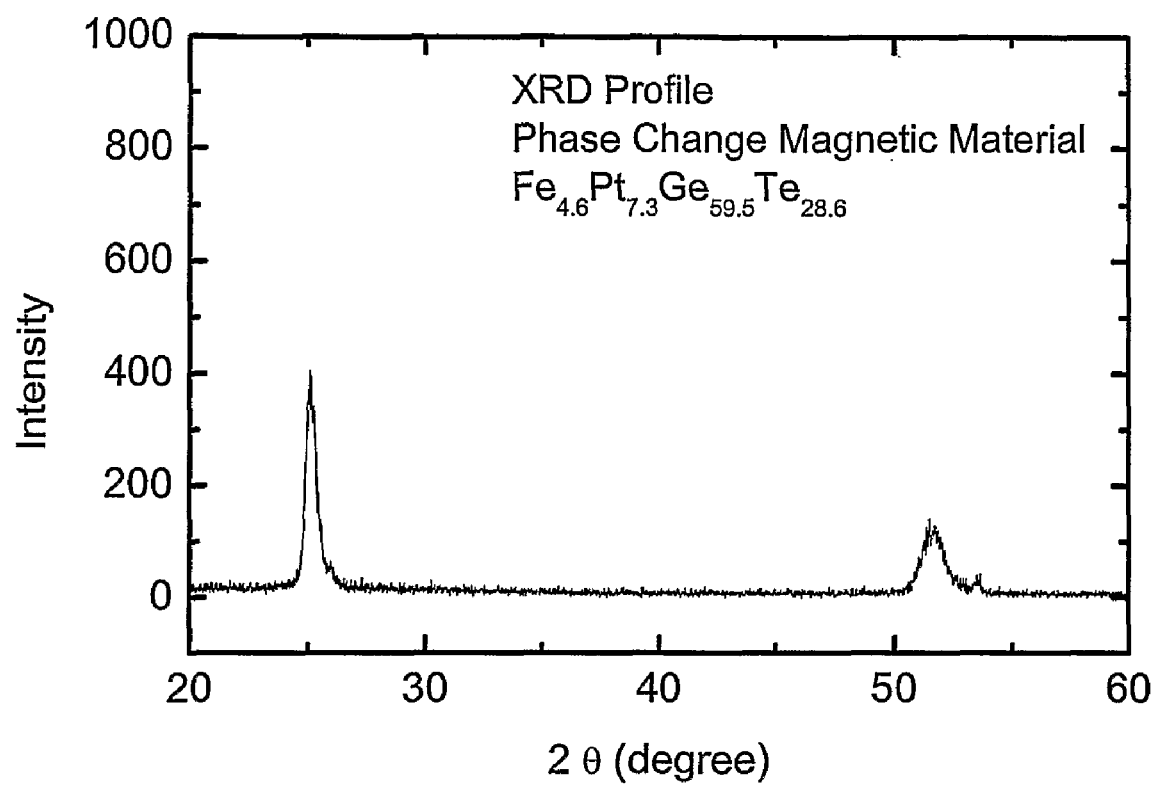

The second sample comprised a Fe—Pt—Ge—Te system that was synthesised according to the synthesis procedure described above. XPS analysis revealed the composition of the synthesised material to be $Fe_{4.6}Pt_{7.3}Ge_{59.5}Te_{28.6}$. FIG. 6b shows the XRD profile characterising the crystal structure of the sample. As can be seen from the XRD profile, the material exhibited crystalline peaks, thus confirming the existence of a crystalline phase for a Fe—Pt—Ge—Te system synthesised at 300° C. An analysis of the peak position identified that the crystal structure of the synthesised $Fe_{4.6}Pt_{7.3}Ge_{59.5}Te_{28.6}$ to be similar to the crystal structure of GeTe.

Based on the experimental results shown in FIGS. 6a to 6b, it can be concluded that phase change magnetic materials have similar crystal structures as phase change materials, or the phase change material component used to synthesise it. One possible explanation for this property is that the atoms of magnetic materials have replaced the atoms of phase change materials in the unit cell of the phase change material, without destroying/disrupting its crystal structure. Therefore, the new material exhibits not only phase change effects due to its similar crystal structure as phase change material, but also magnetic effects caused by the presence of magnetic atoms in the crystal structure.

EXAMPLE 2

Synthesis by Sputtering

Synthesis Procedure

Figure 7B:
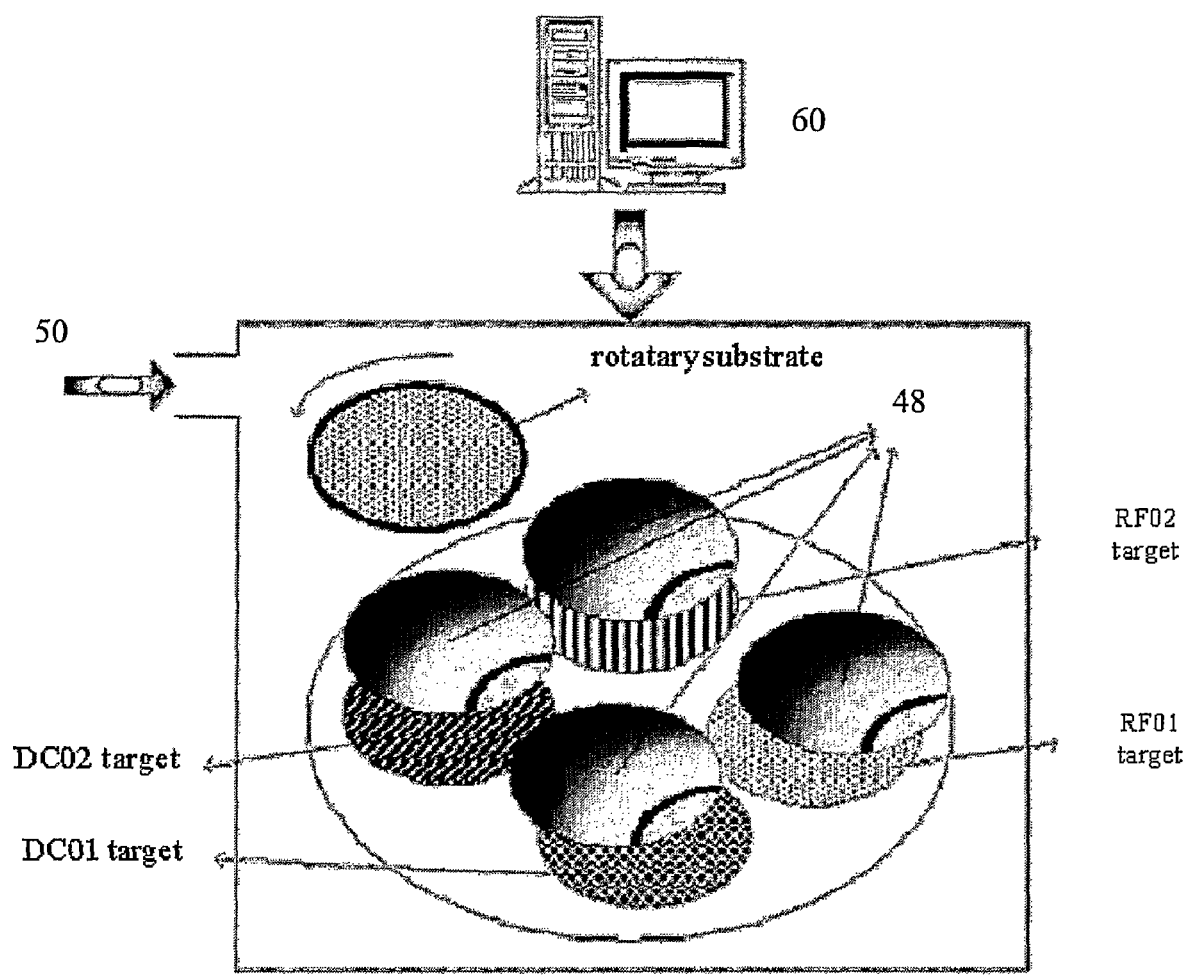

Sputtering method can be employed to synthesize the invented material. In our sputtering system supplied by Leybold Vacuum and schematically illustrated in FIG. 7(b), two DC sputtering cathodes and two RF sputtering cathodes are installed and four targets, 2 of which are labelled DC01 and DC02, and the other are labelled RF02 and RF01, are physically separated from each other. The positions of cathodes are under the targets in FIG. 7(b). The rotary substrate lies on a water-cooled rotation table and the substrate holder as placed 50 mm above the targets. A preshutter 48, which can be controlled to be open or close, is between the targets and substrate holder. The substrate, targets and shutter are placed in a vacuum chamber. Argon gas 50 is introduced into the chamber at low pressure and used as the sputtering gas. A gas plasma is struck using a power source and the gas becomes ionized. The ions are accelerated towards and bombards the target surface, the target atoms are broken off from the target and deposited on the substrate surface. The thin film of invented material is fabricated on the substrate by pausing substrate under the aimed target and opening the shutter during a programmed time controlled by a computer 60.

What is claimed is:
1. A homogeneous phase change magnetic composite material exhibiting both magnetic effects and phase change effects, comprising:
 a phase change material component, and a ferromagnetic material component,
 wherein said phase change magnetic composite material has a single crystalline phase associated therewith a first magnetic property and a first phase change property, wherein atoms of the magnetic material component have replaced atoms of the phase change material component in the unit cell of the phase change material component, without destroying/disrupting its crystal structure, and an amorphous phase associated therewith a second magnetic property and a second phase change property, wherein when the material undergoes phase change from crystalline phase to amorphous phase, the material exhibits a corresponding change in both its phase change properties and its magnetic properties.

2. The phase change magnetic material of claim 1, wherein said first and said second phase change property each comprises at least one property selected from electrical resistivity, thermal conductivity, light reflectivity, refractive index, absorption coefficient, dielectric constant, and thermal diffusion coefficient.

3. The phase change magnetic material of claim 1, wherein said first and said second magnetic property each comprises at least one property selected from saturation magnetization, coercive field, anisotropy field, uniaxial anisotropy, squareness, remanence magnetization, saturation induction, Curie temperature and compensation temperature.

4. The phase change magnetic material of claim 1, wherein said material exhibits at least one physical state selected from a crystalline state, an amorphous state and a partial crystalline state.

5. The phase change magnetic material of claim 4, wherein said material exhibits different electrical, magnetic, thermal, crystallization, and optical properties at each of said at least one physical state.

6. The phase change magnetic material of claim 1, wherein said material in the crystalline state has a coercivity of at least about 1 Oersteds.

7. The phase change magnetic material of claim 1, wherein the resistivity ρ of said material is in the range of $1 \times 10^{-3}$ Ωcm<ρ<$1 \times 10^3$ Ωcm at amorphous state and in the range of $1 \times 10^{-4}$ Ωcm<ρ<$1 \times 10^{-1}$ Ωcm at crystalline state, the resistivity difference of said material between the amorphous state and the crystalline state being in the magnitude of 2 to $10^6$.

8. The phase change magnetic material of claim 1, wherein said phase change material component comprises at least one element selected from Group IIIB, IVB, VB or VIB of the Periodic Table.

9. The phase change magnetic material of claim 8, wherein the phase change material component is an element selected from the group consisting of Te, S, Se, Po, P, As, Sb, Bi, Ge, Sn, Pb, Ga, In, and Ti.

10. The phase change magnetic material of claim 8, wherein the phase change component comprises a chalcogenide alloy.

11. The phase change magnetic material of claim 10, wherein the chalcogenide alloy is selected from the group consisting of the following systems: Ge—Te, Sb—Te, Sn—Te, Sb—Se, In—Se, Ge—Sb—Te, Pt—Ge—Te, In—Sb—Te, As—Sb—Te, As—Ge—Te, Se—Sb—Te, Sn—Te—Se, Ge—Te—Sn, Sb—Se—Bi, Ga—Te—Se, In—Se—Ti, Ge—Te—Ti, Ge—Te—Sn—O, Ge—Te—Sn—Au, Ge—Te—Sn—Pd, Ge—Sb—Te—Se, Ag—In—Sb—Te and mixtures thereof.

12. The phase change magnetic material of claim 11, wherein the chalcogenide alloy comprises a system having a formula selected from the group consisting of $Ge_2Sb_2Te_5$, $GeSb_2Te_4$, $GeSb_3Te_4$, $GeSb_4Te_7$, $In_3SbTe_2$, $Ag_5In_5Sb_{60}Te_{30}$, $Sb_2Se_3$, $Sb_2Te_3$, $Sb_{70}Te_{30}$, GeTe, GeSb, and $Sb_2Te_3$—GeTe.

13. The phase change magnetic material of claim 1, wherein said ferromagnetic material component is selected from the group consisting of Fe, Co, Ni, FePt, CoPt, PdCo, TbFeCo, GdFeCo, CoCrPtB, CoCrPtTa.

14. The phase change magnetic material of claim 1, wherein said material has a composition of formula (I):

$$A_xB_y$$

wherein

A denotes the ferromagnetic material component;

B denotes the, phase change material component;

x denotes the total atomic percentage of A, wherein 1%≦x≦50%, and y denotes the total atomic percentage of B, wherein 50%≦y≦99%.

15. The phase change magnetic material of claim 14, wherein

A is selected from the group consisting of Co, Fe, Ni and Fe—Pt, and

B is selected from the group consisting of Ge—Sb—Te, Ge—Te, GeSb, InSbTe, $Sb_{70}Te_{30}$, $Sb_2Te_3$, Sb, Te and Ag—In—Sb—Te.

16. The phase change magnetic material of claim 14, selected from the group consisting of $Co_{6.3}Ge_{31.1}Sb_{27.1}Te_{35.5}$, $Co_{3.6}Ge_{20.8}Sb_{30.5}Te_{44.9}$, $Co_{2.8}Ge_{17.9}Sb_{31.9}Te_{47.1}$, $Co_{6.1}Ge_{14.3}Sb_{33}Te_{46.5}$, $Co_{3.0}Ge_{18.5}Sb_{30.1}Te_{48.2}$, $Co_{5.0}Ge_{16.9}Sb_{31.6}Te_{46.5}$, $Co_{1.5}Ge_{17.3}Sb_{32.9}Te_{48.3}$, $Co_{5.4}Ge_{17.2}Sb_{30.5}Te_{46.9}$, $Co_{2.0}Ge_{17.7}Sb_{32.5}Te_{47.8}$, $Co_{5.8}Ge_{17.1}Sb_{32.3}Te_{44.8}$, $Co_{4.6}Ge_{14.9}$, $Sb_{33.4}Te_{47.1}$, $Co_{10.1}Ge_{14.4}Sb_{34.6}Te_{40.9}$, $Co_{26.1}Ge_{17.2}Sb_{22.1}Te_{34.6}$, $Co_{5.6}Ge_{15.8}Sb_{33.6}Te_{45}$, $Fe_{20.2}Ge_{21.5}Sb_{16.9}Te_{41.4}$, $Fe_{9.2}Ge_{16.3}Sb_{27.4}Te_{47.2}$, $Fe_{4.7}Ge_{18.5}Sb_{28.1}Te_{48.6}$, $Fe_{4.4}Ge_{14.8}Sb_{34.2}Te_{46.6}$, $Fe_{11.1}Ge_{16}Sb_{25.9}Te_{47.1}$, $Fe_{1.0}Ge_{15.7}Sb_{35.2}Te_{48.2}$, $Fe_{7.2}Ge_{14.7}Sb_{32.9}Te_{45.2}$, $Fe_{28.2}Pt_{32.4}Ge_{30.0}Te_{9.3}$, $Fe_{4.1}Pt_{4.2}Ge_{64.5}Te_{27.1}$, $Fe_{2.1}Pt_{5.5}Ge_{63.9}Te_{28.4}$, $Fe_{1.1}Pt_{2.7}Ge_{64.3}Te_{31.9}$, $Fe_{4.6}Pt_{7.3}Ge_{59.5}Te_{28.6}$, $Fe_{5.0}Pt_{6.8}Ge_{59.6}Te_{28.6}$, $Fe_{1.1}Pt_{1.1}Ge_{50.4}Te_{31.1}$, $Fe_{4.8}Pt_{4.6}Ge_{58.2}Te_{32.4}$, $Fe_{1.2}Pt_{2.5}Ge_{54.2}Te_{41.9}$, and $Fe_{1.0}Pt_{2.0}Ge_{62.1}Te_{34.9}$.

17. The phase change magnetic material of claim 1, having a composition of formula (II):

$$A_xB_yC_z$$

wherein

A denotes a ferromagnetic component;

B denotes the phase change component;

C denotes a manganese compound component;

x denotes the total atomic percentage of A, wherein 1%≦x≦40%, y denotes the total atomic percentage of B, wherein 40%≦y≦98%, and z denotes the total atomic percentage of C, wherein 1%≦y≦20%.

18. The phase change magnetic material of claim 17, wherein

A is selected from the group consisting of Co, FeNi and Fe—Pt, and

B is selected from the group consisting of Ge—Sb—Te, Ge—Te, GeSb, InSbTe, $Sb_{70}Te_{30}$, $Sb_2Te_3$, Sb, Te and Ag—In—Sb—Te.

19. The phase change magnetic material of claim 1, wherein the crystal structure of the material is at least substantially similar to the crystal structure of the phase change material component.

20. The phase change magnetic material of claim 1, wherein the unit cell of the crystal structure of the material comprises at least one atom of the phase change material component and at least one atom of the magnetic material component.

21. The phase change magnetic material of claim 1, wherein said material is synthesized by a method selected from laser ablation, laser synthesis, sputtering, ion plating, chemical vapor deposition (CVD), plasma enhanced chemical vapor, metal organic chemical vapor deposition, spin coating, molecular beam epitaxy, top-seeded solution growth, thermal pressing, vacuum melting, and crystal growth.

22. A device comprising a homogeneous phase change magnetic composite material exhibiting both magnetic effects and phase change effects, comprising:
   a phase change material component, and a ferromagnetic material component, wherein said phase change magnetic composite material has
      a single crystalline phase associated therewith a first magnetic property and a first phase change property, wherein atoms of the magnetic material component have replaced atoms of the phase change material component in the unit cell of the phase change material component, without destroying/disputing its crystal structure, and
      an amorphous phase associated therewith a second magnetic property and a second phase change property,
   wherein when the material undergoes phase change from crystalline phase to amorphous phase, the materiel exhibits a corresponding change in both its phase change properties and its magnetic properties, wherein the device is selected from optical media, phase change random access memory (PCRAM) devices, magnetic random access memory (MRAM) devices, solid state memory devices, sensor devices, logical devices, artificial neuron network, cognitive devices, three level device, control device, SDC device and semiconductors.

23. A homogeneous optical recording medium for recording information, said medium comprising
   a phase change material component, and a ferromagnetic material component,
   wherein
   said phase change magnetic composite material has
   a single crystalline phase associated therewith a first magnetic property and a first phase change property, wherein the atoms of magnetic materials have replaced the atoms of phase change materials in the unit cell of the phase change material, without destroying/disrupting its crystal structure, and
   an amorphous phase associated therewith a second magnetic property and a second phase change property
   such that when the material undergoes phase change from crystalline phase to amorphous phase, the material exhibits a corresponding change in both its phase change properties and its magnetic properties.

* * * * *